(12) United States Patent
Toyomura

(10) Patent No.: US 12,190,810 B2
(45) Date of Patent: Jan. 7, 2025

(54) PIXEL CIRCUIT, DISPLAY DEVICE, AND DRIVING METHOD

(71) Applicant: SONY SEMICONDUCTOR SOLUTIONS CORPORATION, Kanagawa (JP)

(72) Inventor: Naobumi Toyomura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/255,585

(22) PCT Filed: Nov. 26, 2021

(86) PCT No.: PCT/JP2021/043419
§ 371 (c)(1),
(2) Date: Jun. 1, 2023

(87) PCT Pub. No.: WO2022/124099
PCT Pub. Date: Jun. 16, 2022

(65) Prior Publication Data
US 2024/0112631 A1    Apr. 4, 2024

(30) Foreign Application Priority Data
Dec. 9, 2020 (JP) ................................ 2020-204327

(51) Int. Cl.
G09G 3/3233 (2016.01)
(52) U.S. Cl.
CPC ... *G09G 3/3233* (2013.01); *G09G 2300/0819* (2013.01); *G09G 2300/0852* (2013.01);
(Continued)

(58) Field of Classification Search
None
See application file for complete search history.

(56) References Cited

U.S. PATENT DOCUMENTS

| 9,721,942 B2 * | 8/2017 | Kimura | ............... H01L 27/0629 |
| 2006/0007192 A1 * | 1/2006 | De Smet | .............. G09G 3/3614 |
| | | | 345/204 |

FOREIGN PATENT DOCUMENTS

| JP | 2013-050697 A | 3/2013 |
| JP | 2014-219440 A | 11/2014 |

(Continued)

OTHER PUBLICATIONS

International Search Report and Written Opinion of PCT Application No. PCT/JP2021/043419, issued on Jan. 25, 2022, 09 pages of ISRWO.

*Primary Examiner* — Matthew Yeung
(74) *Attorney, Agent, or Firm* — CHIP LAW GROUP

(57) ABSTRACT

Provided are a pixel circuit, a display device, and a driving method that suppress a decrease in luminance. A pixel circuit according to the present disclosure includes a first transistor configured to control a current supplied to a light emitting element according to a voltage supplied to a first terminal, a first capacitor configured to hold the voltage supplied to the first terminal, a second transistor configured to sample a signal voltage of a video signal line, a second capacitor configured to hold the signal voltage sampled by the second transistor, and a third transistor configured to connect the second capacitor and the first capacitor and set a voltage corresponding to the signal voltage to the first capacitor by transferring electric charges accumulated in the second capacitor to the first capacitor.

12 Claims, 11 Drawing Sheets

(52) U.S. Cl.
CPC . *G09G 2300/0861* (2013.01); *G09G 2310/08* (2013.01); *G09G 2320/0233* (2013.01); *G09G 2320/0247* (2013.01); *G09G 2320/045* (2013.01)

(56) References Cited

FOREIGN PATENT DOCUMENTS

| | | |
|---|---|---|
| JP | 2015-034861 A | 2/2015 |
| JP | 2019-082548 A | 5/2019 |
| WO | 2015/104777 A1 | 7/2015 |

\* cited by examiner

PIXEL CIRCUIT, DISPLAY DEVICE, AND DRIVING METHOD

CROSS REFERENCE TO RELATED APPLICATIONS

This application is a U.S. National Phase of International Patent Application No. PCT/JP2021/043419 filed on Nov. 26, 2021, which claims priority benefit of Japanese Patent Application No. JP 2020-204327 filed in the Japan Patent Office on Dec. 9, 2020. Each of the above-referenced applications is hereby incorporated herein by reference in its entirety.

TECHNICAL FIELD

The present disclosure relates to a pixel circuit, a display device, and a driving method.

BACKGROUND ART

A micro-organic light emitting diode (M-OLED) panel including pixels, each including a metal-oxide-semiconductor (MOS) transistor, an organic electro luminescence (EL) diode, and the like on a silicon substrate, has been used as a display of augmented reality (AR) glasses.

In AR, importance is placed on superimposition of the real world and the display video. As one of the methods for enhancing the superimposition, a surface batch light emission drive for causing all pixels of a panel to simultaneously emit light is conceivable.

Examples of the surface batch light emission drive system include a method in which variations in threshold of a drive transistor that drives an organic EL diode of each pixel and the like are corrected, a video signal is written to each pixel, and batch light emission is performed using a blanking period or the like in one frame. In this method, however, a light emission period in one frame is very short. This causes a problem such as a decrease in luminance or visual recognition of flickers due to a low in ratio of the light emission time to one frame (low duty cycle).

CITATION LIST

Patent Document

Patent Document 1: Japanese Patent Application Laid-Open No. 2015-34861

SUMMARY OF THE INVENTION

Problems to be Solved by the Invention

The present disclosure provides a pixel circuit, a display device, and a driving method that suppress a decrease in luminance.

Solutions to Problems

A pixel circuit according to the present disclosure includes
 a first transistor configured to control a current supplied to a light emitting element according to a voltage supplied to a first terminal,
 a first capacitor configured to hold the voltage supplied to the first terminal,
 a second transistor configured to sample a signal voltage of a video signal line,
 a second capacitor configured to hold the signal voltage sampled by the second transistor, and
 a third transistor configured to connect the second capacitor and the first capacitor and set a voltage corresponding to the signal voltage to the first capacitor by transferring electric charges accumulated in the second capacitor to the first capacitor.

A display device according to the present disclosure includes
 a pixel circuit including a first transistor configured to control a current supplied to a light emitting element according to a voltage supplied to a first terminal, a first capacitor configured to hold the voltage supplied to the first terminal, a second transistor configured to sample a signal voltage of a video signal line, a second capacitor configured to hold the signal voltage sampled by the second transistor, and a third transistor configured to connect the second capacitor and the first capacitor and set a voltage corresponding to the signal voltage to the first capacitor by transferring electric charges accumulated in the second capacitor to the first capacitor, and
 a drive circuit configured to control an operation of the second transistor and an operation of the third transistor.

A driving method according to the present disclosure includes
 supplying a voltage held by a first capacitor to a first terminal of a first transistor, the first transistor being configured to control a current supplied to a light emitting element,
 driving the first transistor according to the voltage supplied to the first terminal,
 sampling a signal voltage of a video signal line,
 holding, by a second capacitor, the signal voltage sampled, and
 connecting, after the signal voltage is held by the second capacitor, the second capacitor and the first capacitor and setting a voltage corresponding to the signal voltage to the first capacitor by transferring electric charges accumulated in the second capacitor to the first capacitor.

MODE FOR CARRYING OUT THE INVENTION

Figure 1:
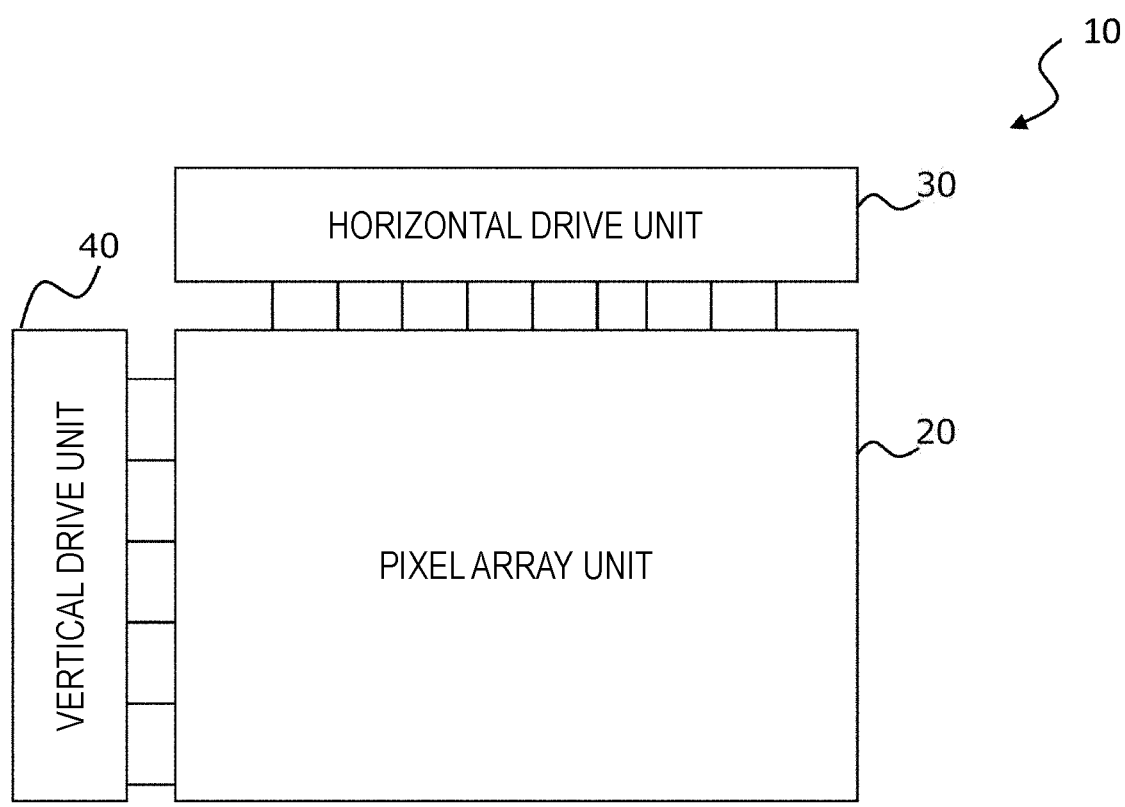
FIG. 1 is a configuration diagram schematically illustrating the entirety of an active matrix display device according to an embodiment of the present disclosure.

Hereinafter, embodiments of the present disclosure will be described with reference to the drawings. In one or more embodiments described in the present disclosure, elements included in each embodiment can be combined with each other, and the resultant combined element also forms a part of the embodiments described in the present disclosure. In the drawings, elements having the same or equivalent functions or elements having the same names are denoted by the same reference numerals, and a detailed description of such elements may be omitted as needed.

FIG. 1 is a configuration diagram schematically illustrating the entirety of an active matrix display device according to an embodiment of the present disclosure. Here, an active matrix organic EL display device using an organic EL diode as a light emitting unit (light emitting element) of a pixel circuit, such as a micro OLED (M-OLED) panel, will be described as an example. Hereinafter, the "pixel circuit" may be simply referred to as a "pixel".

An organic EL display device 10 in FIG. 1 includes a pixel array unit 20 in which a plurality of pixels each including an organic EL diode is arranged in a two-dimensional matrix, and a drive circuit disposed around the pixel array unit 20. The drive circuit includes a horizontal drive unit 30 and a vertical drive unit 40. The vertical drive unit 40 sequentially selects, in a vertical direction, a pixel group of one row in a horizontal direction in the pixel array unit 20. The horizontal drive unit 30 writes a signal such as a video signal to the pixel group of one row selected by the vertical drive unit 40.

Hereinafter, before giving a detailed description of the embodiment of the present disclosure, an organic EL display device according to a comparative example will be described. An overall block diagram of the organic EL display device in the comparative example is the same as illustrated in FIG. 1.

Figure 2:
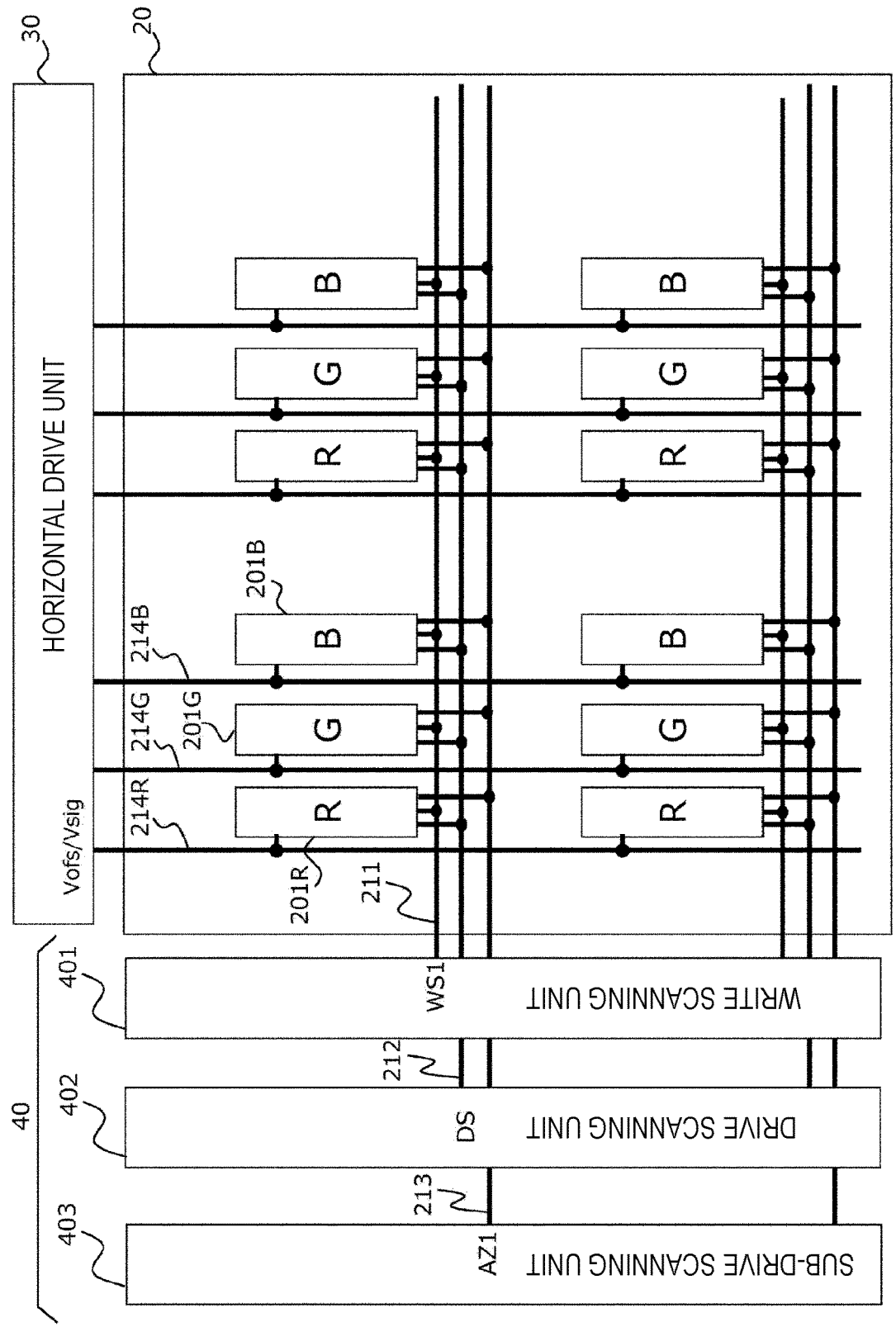
FIG. 2 is a detailed block diagram of an organic EL display device according to a comparative example.

FIG. 2 is a detailed block diagram of the organic EL display device according to the comparative example. For the sake of description, the same reference numerals are given to elements identical in name to the elements in FIG. 1. The organic EL display device in FIG. 2 includes a pixel array unit 20 in which a plurality of unit pixels each including an organic EL diode is arranged in a two-dimensional matrix, a horizontal drive unit 30, and a vertical drive unit 40. The vertical drive unit 40 includes a write scanning unit 401, a drive scanning unit 402, and a sub-drive scanning unit 403. The unit pixel includes a pixel 201R that emits red (R) light, a pixel 201G that emits blue (B) light, and a pixel 201B that emits green (G) light. The RGB pixels are each referred to as a pixel 201 unless otherwise distinguished.

Here, a configuration example in a case where the organic EL display device in FIG. 2 is adapted to color display will be described. The unit pixel serving as a unit for forming a color image includes the plurality of RGB pixels. Note that the unit pixel is not limited to a combination of pixels of three primary colors of RGB. In a case of a monochrome display device, each unit pixel may include only one pixel of a single color. Alternatively, each unit pixel may further include a pixel of one color or pixels of a plurality of colors in addition to the pixels of three primary colors. For example, a pixel that emits white (W) light may be added to the unit pixel in order to increase luminance.

In the pixel array unit 20, a scanning line 211, a drive line 212, and a sub-drive line 213 are provided to the two-dimensional array of the pixels 201 on a pixel row-by-pixel row basis along a row direction. A signal line 214 is further provided to the two-dimensional array of the pixels 201 on a pixel column-by-pixel column basis along a column direction. More specifically, a signal line 214R is provided to the two-dimensional array of the pixels 201R on a pixel column-by-pixel column basis along the column direction. A signal line 214G is provided to the two-dimensional array of the pixels 201G on a pixel column-by-pixel column basis along the column direction. A signal line 214B is provided to the two-dimensional array of the pixels 201B on a pixel column-by-pixel column basis along the column direction. The RGB signal lines are each referred to as the signal line 214 unless otherwise distinguished.

The scanning line 211 is connected to an output end of a corresponding row of the write scanning unit 401. The drive line 212 is connected to an output end of a corresponding row of the drive scanning unit 402. The sub-drive line 213 is connected to an output end of a corresponding row of the sub-drive scanning unit 403. The signal line 214 is connected to an output end of a corresponding column of the horizontal drive unit 30.

The write scanning unit 401 includes a shift register circuit and the like. When writing a signal voltage of a video signal or an offset voltage (to be described later) to each pixel 201 of the pixel array unit 20, the write scanning unit 401 sequentially scans each pixel 201 of the pixel array unit 20 on a row-by-row basis by sequentially supplying a write scanning signal WS1 to the scanning line 211.

The drive scanning unit 402 includes a shift register circuit and the like, in a similar manner to the write scanning unit 401. The drive scanning unit 402 controls light emission/non-light emission (light emission off) of the pixel 201 by supplying a light emission control signal DS to the drive line 212 in synchronization with the scanning performed by the write scanning unit 401.

The sub-drive scanning unit 403 includes a shift register circuit and the like, in a similar manner to the write scanning unit 401. The sub-drive scanning unit 403 performs control to prevent the pixel 201 from emitting light during a non-light emission period by supplying a sub-drive signal AZ1 to the sub-drive line 213 in synchronization with the scanning performed by the write scanning unit 401.

The horizontal drive unit 30 selectively outputs a signal voltage Vsig of a video signal corresponding to luminance information supplied from a signal supply source (not illustrated) (hereinafter, may be simply referred to as a "signal voltage") and an offset voltage Vofs. Here, the offset voltage Vofs is a voltage corresponding to or near a voltage serving as a reference for the signal voltage Vsig of the video signal (for example, a voltage corresponding to a black level of the video signal). The offset voltage Vofs is an initialization voltage to be used when correction processing to be described later is performed.

The signal voltage Vsig/offset voltage Vofs exclusively output from the horizontal drive unit 30 is written to each pixel 201 of the pixel array unit 20 through the signal line 214 for each row selected by the scanning performed by the write scanning unit 401.

Figure 3:
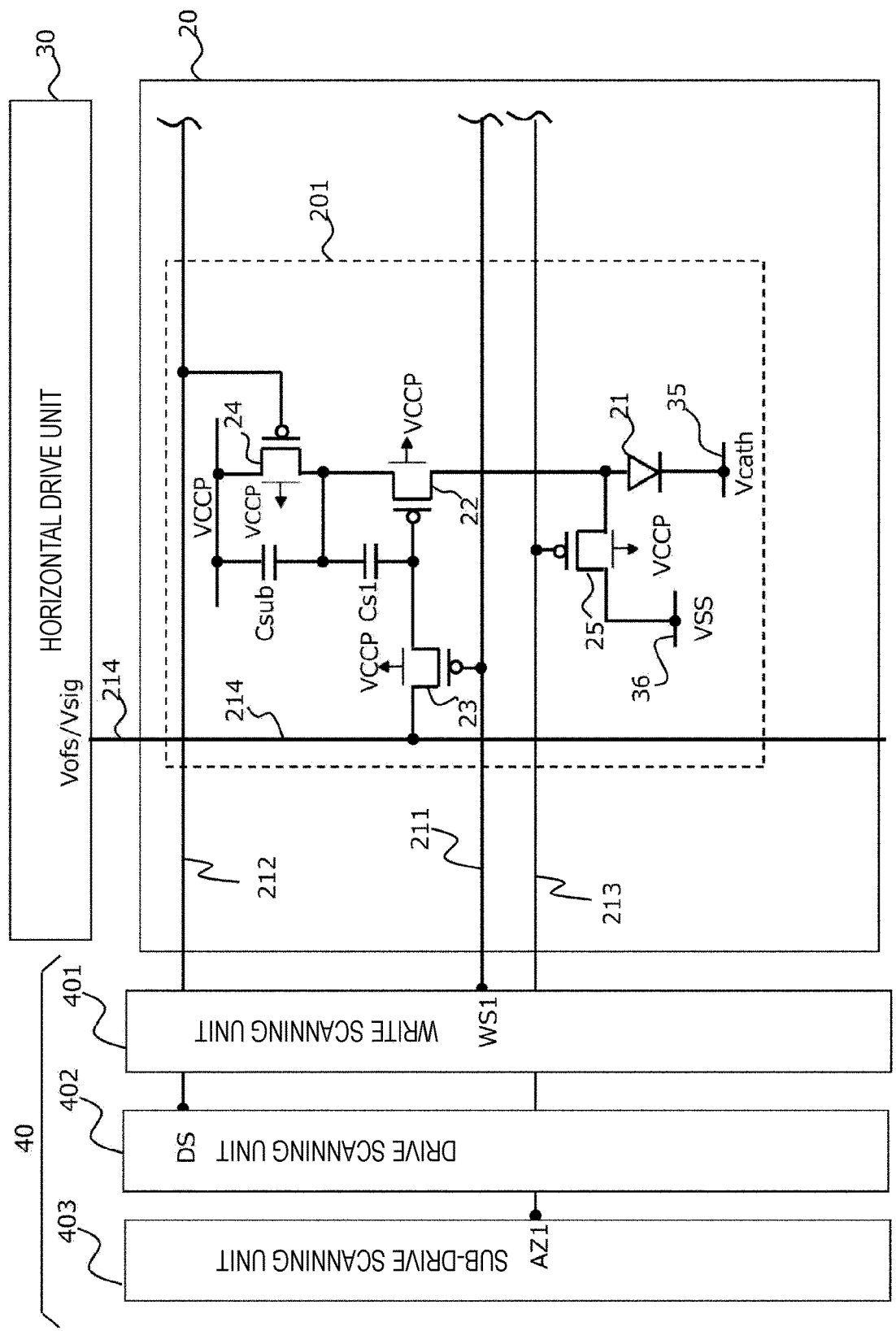
FIG. 3 is a diagram illustrating a circuit example of a pixel and a peripheral circuit in the comparative example.

FIG. 3 is a diagram illustrating a circuit example of the pixel (pixel circuit) 201 and a peripheral circuit (the horizontal drive unit 30, the vertical drive unit 40). A light emitting unit of the pixel 201 includes an organic EL diode 21. The organic EL diode 21 is an example of a current-driven electro-optical element that varies in light emission luminance in a manner that depends on a value of a current flowing through the device.

The pixel 201 includes the organic EL diode 21 and an element drive circuit that drives the organic EL diode 21 by causing a current to flow through the organic EL diode 21. The organic EL diode 21 has a cathode electrode connected to a common power supply line 35 provided in common for all the pixels 201. A voltage of the common power supply line 35 is a voltage Vcath.

The element drive circuit that drives the organic EL diode 21 includes a drive transistor 22, a sampling transistor 23, a light emission control transistor 24, a switching transistor 25, a capacitor Cs1, and a sub-capacitor Csub. Note that, in the present embodiment, the pixel (pixel circuit) 201 is formed on a semiconductor such as silicon rather than an insulator such as a glass substrate. Then, the drive transistor 22 is a P-channel MOS transistor (PMOS transistor). Furthermore, in the present embodiment, in a similar manner to the drive transistor 22, the sampling transistor 23, the light emission control transistor 24, and the switching transistor 25 are also P-channel MOS transistors. The drive transistor 22, the sampling transistor 23, the light emission control transistor 24, and the switching transistor 25 each have four terminals of source/gate/drain/back gate rather than three terminals of source/gate/drain. A power supply voltage VCCP is applied to the back gate of each transistor. That is, a well potential of each transistor is VCCP.

In the pixel 201, the sampling transistor 23 writes the video signal to the gate node (gate electrode) of the drive transistor 22 by sampling the signal voltage Vsig supplied from the horizontal drive unit 30 through the signal line 214. The drive transistor 22 controls light emission of the organic EL diode 21 according to a voltage applied to the gate electrode. The gate electrode of the drive transistor 22 corresponds to a first terminal of a drive transistor that controls the emission of the light emitting element. The first terminal is a control terminal, a drain terminal, or a source terminal, and is a control terminal in the present embodiment.

The light emission control transistor 24 is connected between a power supply node of the power supply voltage VCCP and the source electrode (source node) of the drive transistor 22, and controls light emission/non-light emission of the organic EL diode 21 under the drive based on the light emission control signal DS. The switching transistor 25 is connected between the drain electrode (drain node) of the drive transistor 22 and a common reference line 36 common to all the pixels. The switching transistor 25 performs control to prevent the organic EL diode 21 from emitting light during the non-light emission period of the organic EL diode 21 under the drive based on the drive signal AZ1. The common reference line 36 has a reference voltage VSS and functions as a current discharge destination node.

The capacitor Cs1 is connected between the gate electrode (gate node) of the drive transistor 22 and the source electrode of the drive transistor 22, and holds the signal voltage Vsig written by the sampling performed by the sampling transistor 23. The voltage of the capacitor Cs1 is applied to the gate electrode. The drive transistor 22 drives the organic EL diode 21 by causing a drive current corresponding to the voltage held by the capacitor Cs1 to flow through the organic EL diode 21. The sub-capacitor Csub is connected between the source electrode of the drive transistor 22 and a node (in this example, the power supply node of the power supply voltage VCCP) having a constant potential. The sub-capacitor Csub acts not only to prevent a source voltage of the drive transistor 22 from fluctuating when the signal voltage Vsig is written and but also to set a gate-source voltage Vgs of the drive transistor 22 at a threshold voltage Vth of the drive transistor 22.

Figure 4:
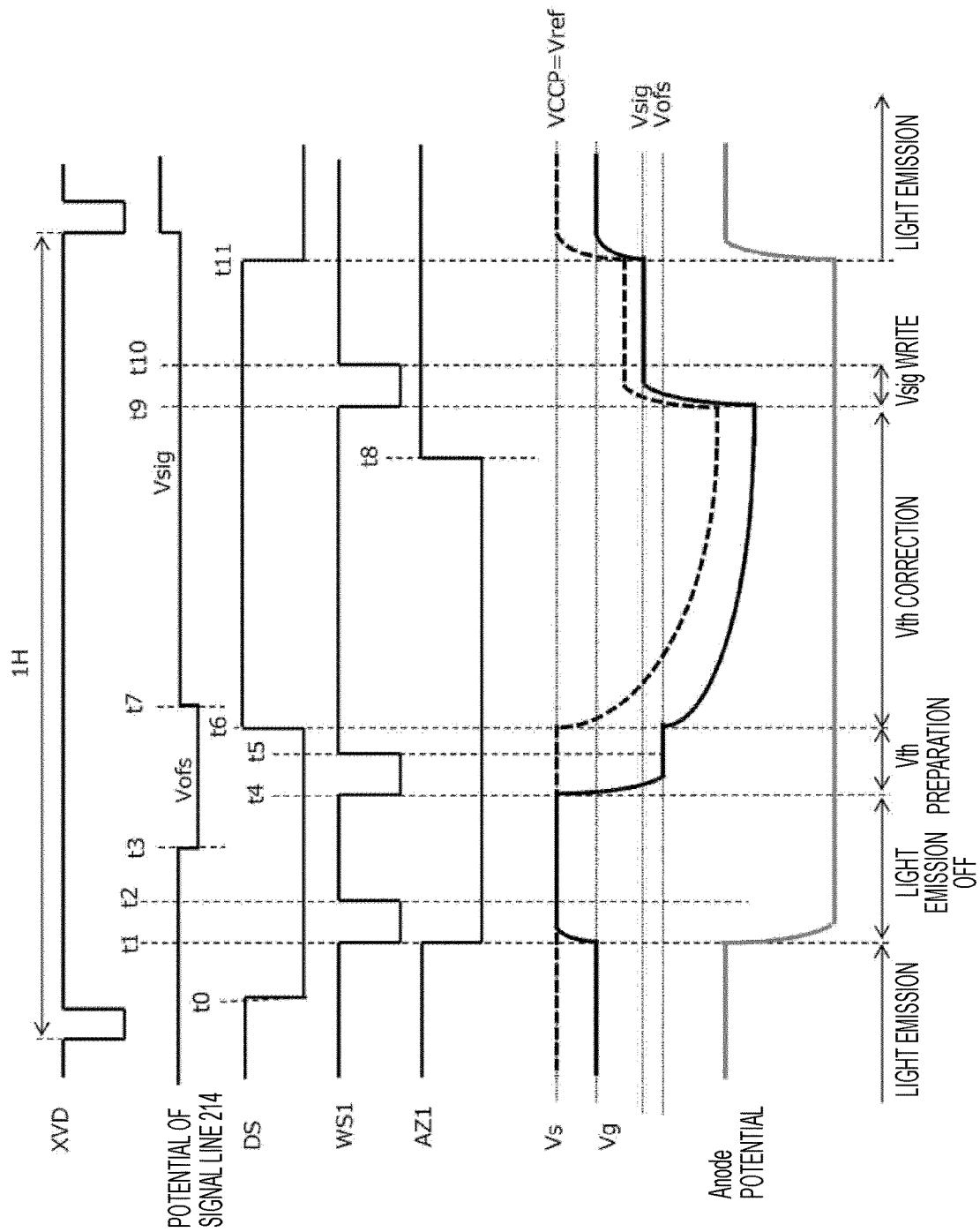
FIG. 4 is a timing waveform diagram of an operation of driving the organic EL display device in the comparative example.

FIG. 4 is a timing waveform diagram of an operation of driving the organic EL display device in FIG. 2 or 3. Changes over time in synchronization signal XVD indicating the start of the horizontal period, potential Vofs/Vsig of the signal line 214, light emission control signal DS, write scanning signal WS1, sub-drive signal AZ1, source voltage Vs and gate voltage Vg of the drive transistor 22, and anode potential of the organic EL diode are shown.

Since the sampling transistor 23, the light emission control transistor 24, and the switching transistor 25 are P-channel MOS transistors, when being in a low voltage state, the write scanning signal WS1, the light emission control signal DS, and the sub-drive signal AZ1 each indicate an active state. When being in a high voltage state, the write scanning signal WS1, the light emission control signal DS, and the sub-drive signal AZ1 each indicate an inactive state. The sampling transistor 23, the light emission control transistor 24, and the switching transistor 25 are turned on (brought into a conducting state), respectively, when the write scanning signal WS1, the light emission control signal DS, and the drive signal AZ1 are brought into the active state, and are turned off (brought into a non-conducting state), respectively, when the write scanning signal WS1, the light emission control signal DS, and the drive signal AZ1 are brought into the inactive state.

When the synchronization signal XVD indicating the start of the horizontal period changes from a high voltage (high level) to a low voltage (low level), one horizontal period (1H) starts. The synchronization signal XVD is input from a synchronization counter (not illustrated).

At time t0, the control light emission signal DS transitions from the high voltage to the low voltage, so that the light emission control transistor 24 is turned on.

At time t1, the write scanning signal WS1 transitions from the high voltage to the low voltage, so that the sampling transistor 23 is turned on.

Furthermore, at time t1, the light emission control signal DS is in the low voltage state and the light emission control transistor 24 is on, so that the source voltage Vs of the drive transistor 22 is the power supply voltage VCCP. The horizontal drive unit 30 outputs the signal voltage Vsig to the signal line 214. The signal voltage Vsig is written to the gate electrode of the drive transistor 22 by the sampling performed by the sampling transistor 23, and the gate voltage Vg of the drive transistor 22 increases accordingly. In the example in the drawing, VCCP (for example, corresponding to a voltage of black luminance) is written, and the gate voltage Vg is the power supply voltage VCCP.

Furthermore, the sub-drive scanning unit 403 brings the sub-drive signal AZ1 into the active state (low potential state) during a period from time t1 to time t8. The period from time t1 to time t8 corresponds to the non-light emission period during which the organic EL diode 21 is forcibly prevented from emitting light. When the sub-drive signal AZ1 is brought into the active state, the switching transistor 25 is turned on in response to the transition. When the switching transistor 25 is turned on, the drain electrode of the drive transistor 22 (the anode electrode of the organic EL diode 21) and the common power supply line 35 serving as the current discharge destination node are electrically short-circuited via the switching transistor 25. The switching transistor 25 is much smaller in on-resistance than the organic EL diode 21, so that the current flowing through the drive transistor 22 flows into the common power supply line 35 and does not flow into the organic EL diode 21. As a result, during the non-light emission period of the organic EL diode 21, the current flowing through the drive transistor 22 does not flow into the organic EL diode 21. That is, it is possible to prevent the organic EL diode 21 from emitting light during the non-light emission period. This allows an increase in contrast of the display panel.

At time t2, the write scanning signal WS1 transitions from the low voltage to the high voltage, so that the sampling transistor 23 is turned off.

During a period from time t3 to time t7, the voltage output from the horizontal drive unit 30 to the signal line 214 is changed from the signal voltage Vsig to the offset voltage Vofs.

During a period from time t4 to time t5, the write scanning signal WS1 transitions from the high voltage to the low voltage, so that the sampling transistor 23 is turned on. The voltage of the signal line 214 is the offset voltage Vofs, so that the offset voltage Vofs is written to the gate electrode of the drive transistor 22 by the sampling performed by the sampling transistor 23. The gate voltage Vg of the drive transistor 22 becomes the offset voltage Vofs.

At this time, the gate-source voltage Vgs of the drive transistor 22 becomes Vgs=Vofs−VCCP. The above-described operation of setting the source voltage Vs of the drive transistor 22 at the power supply voltage VCCP and setting the gate voltage Vg of the drive transistor 22 at the offset voltage Vofs corresponds to a preparation operation (threshold correction preparation) before performing threshold correction processing. The power supply voltage VCCP corresponds to the initialization voltage of the source voltage Vs, and the offset voltage Vofs corresponds to the initialization voltage of the gate voltage Vg of the drive transistor 22.

Next, at time t6, when the light emission control signal DS transitions from the low voltage to the high voltage to turn the light emission control transistor 24 off, the source electrode of the drive transistor 22 is brought into a floating state, and the threshold correction processing is started with the gate voltage Vg of the drive transistor 22 held at the offset voltage Vofs. That is, the source voltage Vs of the drive transistor 22 starts to fall (decrease) toward a voltage (Vg−Vth) obtained by subtracting the threshold voltage Vth from the gate voltage Vg of the drive transistor 22.

The operation of changing, with the initialization voltage Vofs of the gate voltage Vg of the drive transistor 22 as a reference, the source voltage Vs of the drive transistor 22 toward the voltage (Vg−Vth) obtained by subtracting the threshold voltage Vth of the drive transistor 22 from the initialization voltage Vofs corresponds to the threshold correction processing. As the threshold correction processing proceeds, the gate-source voltage Vgs of the drive transistor 22 converges to the threshold voltage Vth of the drive transistor 22. A voltage corresponding to the threshold voltage Vth is held by the capacitor Cs1.

At time t8 during the progress of the threshold correction processing, the sub-drive signal AZ1 is brought into the active state (low potential state). In response to the transition, the switching transistor 25 is turned on. As an example, time t8 is a time at which the gate-source voltage Vgs converges or nearly converges to the threshold voltage Vth.

At time t9, when the write scanning signal WS1 transitions from the high voltage to the low voltage to turn the sampling transistor 23 on, a threshold correction period ends. During a period from time t9 to time t10, the signal voltage Vsig of the video signal (voltage corresponding to desired luminance that the pixel 201 is desired to display) is output from the horizontal drive unit 30 to the signal line 214, and the signal voltage Vsig is sampled and written to the pixel 201. The operation of writing the signal voltage Vsig by the sampling transistor 23 makes the gate voltage Vg of the drive transistor 22 equal to the signal voltage Vsig. The signal voltage Vsig is held by the capacitor Cs1.

When the signal voltage Vsig of the video signal is written, the sub-capacitor Csub connected between the source electrode of the drive transistor 22 and the power supply node of the power supply voltage VCCP acts to suppress fluctuations in the source voltage Vs of the drive transistor 22. Then, when the drive transistor 22 is driven by the signal voltage Vsig of the video signal, the threshold voltage Vth of the drive transistor 22 is canceled out by the voltage corresponding to the threshold voltage Vth held by the capacitor Cs1.

At time t11, the light emission control signal DS transitions from the high voltage to the low voltage to turn the light emission control transistor 24 on. As a result, a current is supplied from the power supply node of the power supply voltage VCCP to the drive transistor 22 through the light emission control transistor 24.

While the sampling transistor 23 is off, the gate electrode of drive transistor 22 is electrically separated from the signal line 214 and is in the floating state. Here, while the gate electrode of the drive transistor 22 is in the floating state, the capacitor Cs1 connected between the gate and the source of the drive transistor 22 also causes the gate voltage Vg to fluctuate in synchronization with the fluctuations in the source voltage Vs of the drive transistor 22.

That is, the source voltage Vs and the gate voltage Vg of the drive transistor 22 increase with the gate-source voltage Vgs held by the capacitor Cs1. Then, the source voltage Vs of the drive transistor 22 increases to a light emission voltage Voled of the organic EL diode 21 corresponding to a saturation current of the drive transistor 22.

The gate voltage Vg and the source voltage Vs of the drive transistor 22 fluctuate with the gate-source voltage Vgs, that is, the voltage across the capacitor Cs1, held by the capacitor Cs1.

Then, a drain-source current Ids of the drive transistor 22 starts to flow to the organic EL diode 21, and the anode voltage of the organic EL diode 21 increases according to the current Ids. Thereafter, when the anode voltage of the organic EL diode 21 exceeds a threshold voltage Vthel of the organic EL diode 21, a current starts to flow through the organic EL diode 21, so that the organic EL diode 21 starts to emit light.

As an example, the drive scanning unit 402 performs control to cause all the pixels 201 in the pixel array unit 20 to simultaneously perform the operation of turning the light emission control transistor 24 on at time t11 to cause the organic EL diode 21 to start to emit light. This brings about the surface batch light emission drive for causing all the pixels of the panel to simultaneously emit light.

In the series of circuit operations described above, the threshold correction preparation, the threshold correction, the write of the signal voltage Vsig (signal write), and the light emission operation are performed, for example, in one horizontal period (1H).

Figure 5:
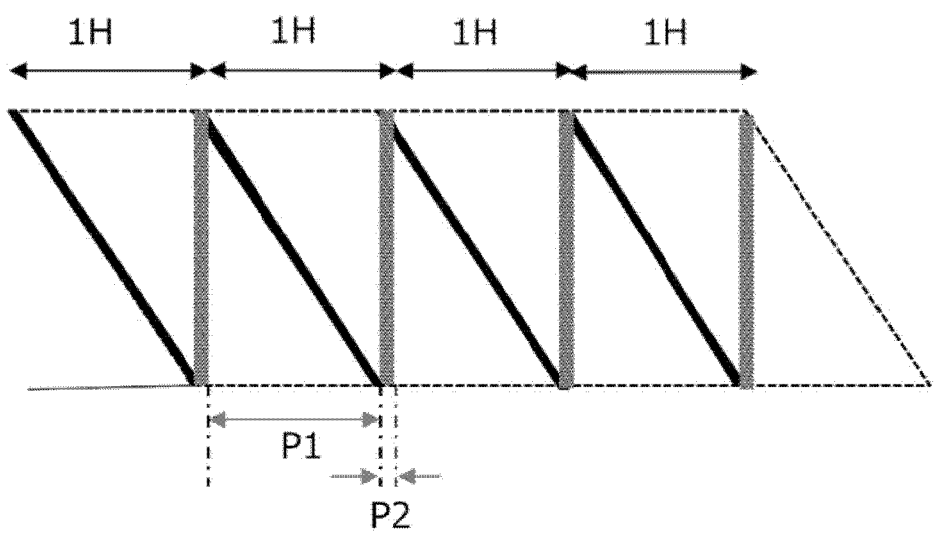
FIG. 5 is a diagram illustrating a relation between a length of a non-light emission period and a length of a light emission period in the drive sequence in FIG. 4.

FIG. 5 is a diagram illustrating a relation between a length of a non-light emission period P1 and a length of a light emission period P2 within one horizontal period (one frame) in the drive sequence shown in FIG. 4. The non-light emission period P1 includes periods such as the threshold correction preparation, the threshold correction, and the write of the signal voltage Vsig (signal write). In the drive sequence in FIG. 4, a ratio of the non-light emission period P2 to one horizontal period is small. The light emission period in one frame is very short, which causes a problem such as a decrease in luminance or visual recognition of flickers.

Therefore, in the embodiment of the present disclosure, the problem in the comparative example is solved by the following configuration. That is, an additional sampling transistor (second sampling transistor 28 in FIG. 7 or 8 to be described later) is provided between the signal line 214 and the source electrode (or drain electrode) of the sampling transistor 23. Then, a capacitor (capacitor Cs2 in FIG. 7 or 8) that holds the video signal voltage of the next frame is provided between a connection node between the sampling transistor 23 and the second sampling transistor 28, and the reference voltage VSS. The signal voltage of the video signal of the next frame (second frame) is written to the capacitor Cs2 using the second sampling transistor 28 during the light emission period of the current frame (first frame). This makes a time from the end of the light emission period of a certain frame to the light emission operation of the next frame (time up to the transition to the light emission operation of the next frame) shorter. It is therefore possible to increase the ratio of the light emission period to one frame period and perform the surface batch light emission with a high light emission duty.

Figure 6:
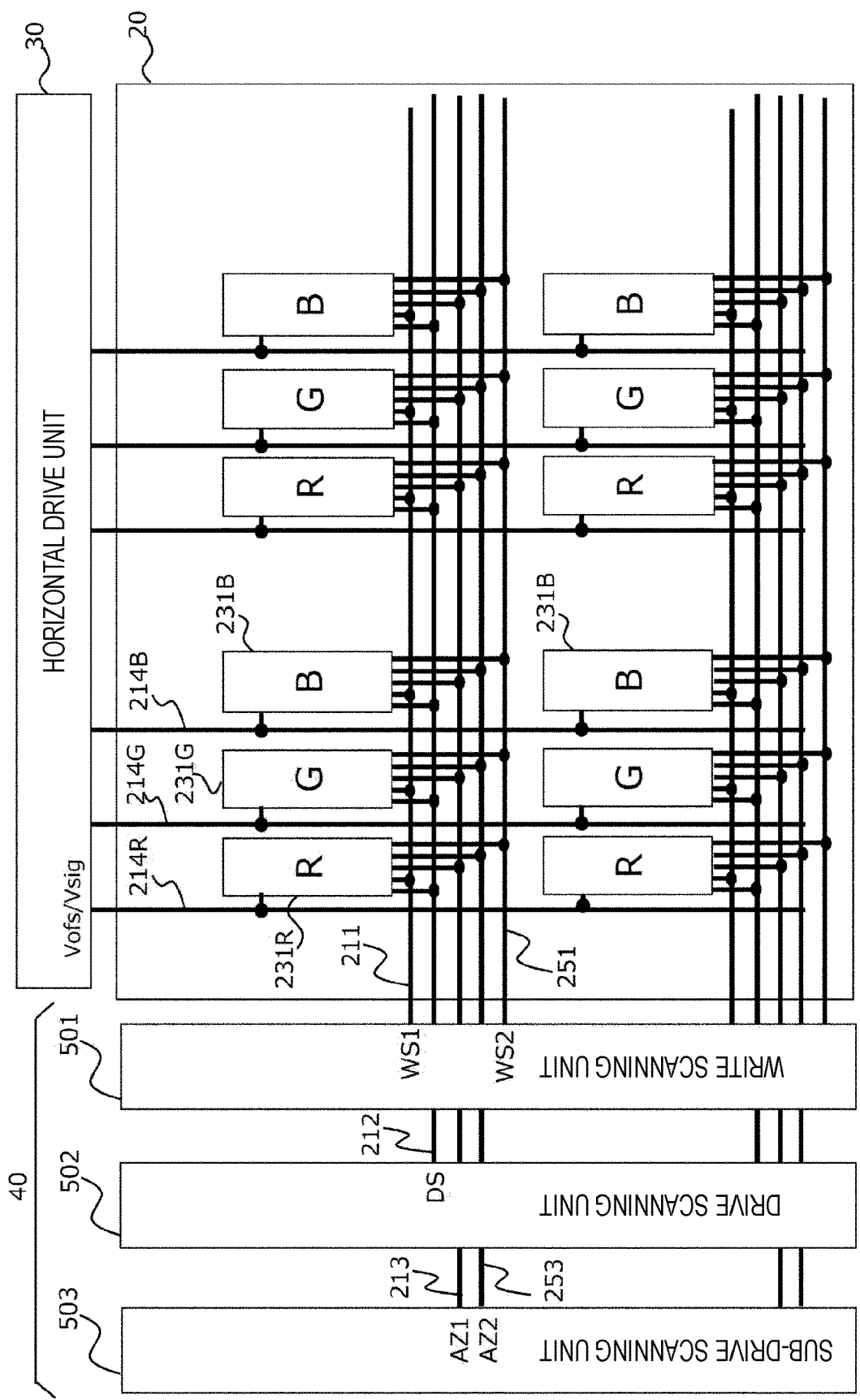
FIG. 6 is a detailed block diagram of an organic EL display device according to the embodiment of the present disclosure.

FIG. 6 is a detailed block diagram of the organic EL display device 10 according to the embodiment of the present disclosure. The organic EL display device 10 in FIG. 6 includes a pixel array unit 20 in which a plurality of unit pixels each including an organic EL diode is arranged in a two-dimensional matrix, a horizontal drive unit 30, and a vertical drive unit 40. The vertical drive unit 40 includes a write scanning unit 501, a drive scanning unit 502, and a sub-drive scanning unit 503. The unit pixel includes a pixel 231R that emits red (R) light, a pixel 231G that emits blue (B) light, and a pixel 231B that emits green (G) light. The RGB pixels are each referred to as a pixel 231 unless otherwise distinguished. In a similar manner to the comparative example in FIG. 2, the unit pixel is not limited to a combination of pixels of three primary colors of RGB.

For the write scanning unit 501, the drive scanning unit 502, the sub-drive scanning unit 503, the horizontal drive unit 30, and the pixel 231, no description will be given of parts identical in function to the write scanning unit 401, the drive scanning unit 402, the sub-drive scanning unit 403, the horizontal drive unit 30, and the pixel 201 described with reference to FIG. 2. A description will be given mainly of functions extended or changed from the comparative example described with reference to FIG. 2.

In the pixel array unit 20, a scanning line (second scanning line) 251 and a sub-drive line (second sub-drive line) 253 are additionally provided on a pixel row-by-pixel row basis along the row direction.

In order to write the signal voltage of the video signal of the current frame to each pixel 231 of the pixel array unit 20, the write scanning unit 501 sequentially scans each pixel 231 on a row-by-row basis by sequentially supplying the write scanning signal WS1 to the scanning line 211. Moreover, in order to write the signal voltage of the video signal of the next frame to each pixel 231 of the pixel array unit 20, the write scanning unit 501 sequentially scans each pixel 231 of the pixel array unit 20 on a row-by-row basis by sequentially supplying a write scanning signal WS2 to the second scanning line 251.

The drive scanning unit 502 controls, in a similar manner to the comparative example illustrated in FIG. 2, light emission/non-light emission (light emission off) of the pixel 231 by supplying the light emission control signal DS to the drive line 212 in synchronization with the scanning performed by the write scanning unit 501.

The sub-drive scanning unit 503 performs, in a similar manner to the comparative example illustrated in FIG. 2, control to prevent the pixel 231 from emitting light during the non-light emission period by supplying the sub-drive signal AZ1 to the sub-drive line 213 in synchronization with the scanning performed by the write scanning unit 501. Moreover, the sub-drive scanning unit 503 performs control to write the offset voltage Vofs to the pixel 231 by supplying a sub-drive signal AZ2 to the second sub-drive line 253 in synchronization with the scanning performed by the write scanning unit 501.

The horizontal drive unit 30 selectively outputs, in a similar manner to the comparative example illustrated in FIG. 2, the signal voltage Vsig of the video signal and the offset voltage Vofs.

Figure 7:
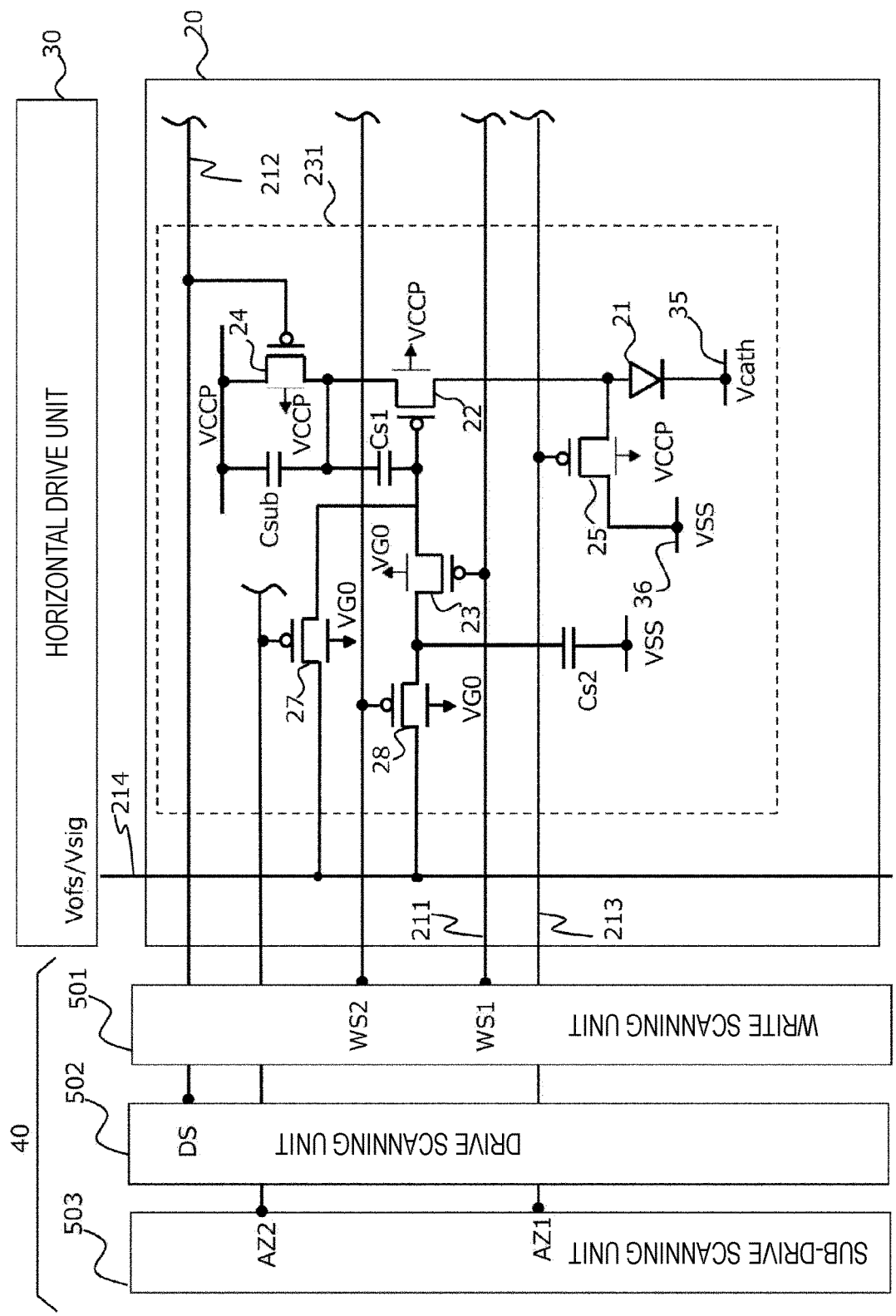
FIG. 7 is a diagram illustrating a circuit example of a pixel and a peripheral circuit in the organic EL display device in FIG. 6.
Figure 8:
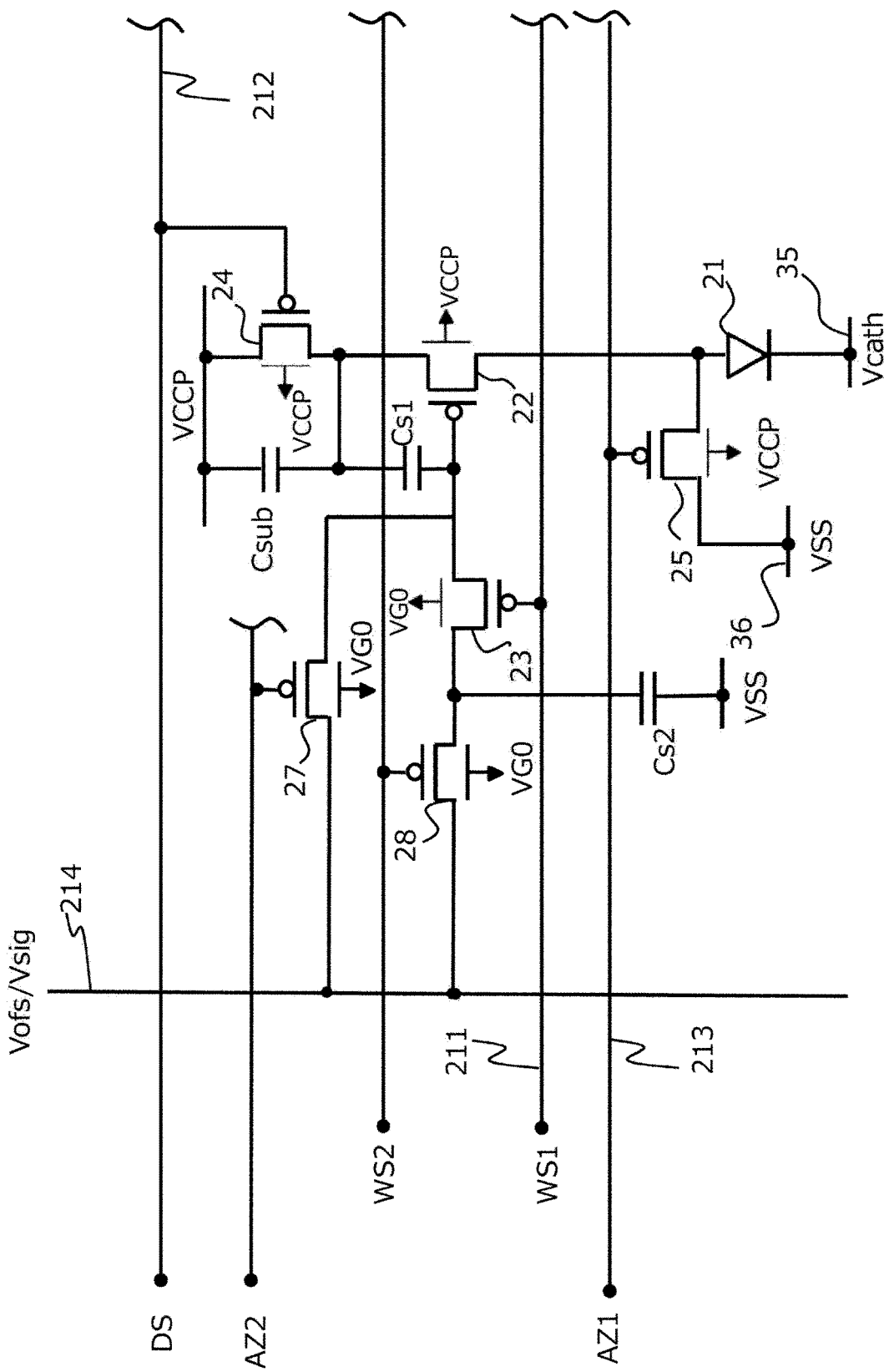
FIG. 8 is a diagram illustrating the pixel extracted from FIG. 7.

FIG. 7 is a diagram illustrating a circuit example of the pixel (pixel circuit) 231 and a peripheral circuit (the horizontal drive unit 30, the vertical drive unit 40). FIG. 8 illustrates the pixel 231 extracted from FIG. 7. In FIGS. 7 and 8, the same elements as the elements in FIG. 3 are denoted by the same reference numerals, and a detailed description of such elements will be omitted as needed.

The second sampling transistor 28 (second transistor), a second switching transistor 27 (fourth transistor), and the capacitor Cs2 (second capacitor) are added to the pixel 201 according to the comparative example in FIG. 3.

The second sampling transistor 28 is connected between the signal line 214 and the source electrode of the sampling transistor 23 (third transistor). The second sampling transistor 28 is a PMOS transistor, and has a source electrode connected to the signal line 214 and a drain electrode connected to the source electrode of the sampling transistor 23. The capacitor Cs2 is connected between the connection node between the second sampling transistor 28 and the sampling transistor 23 and the reference voltage VSS. The second sampling transistor 28 samples the signal voltage Vsig for the next frame supplied from the horizontal drive unit 30 through the signal line 214 to write the signal voltage Vsig to the capacitor Cs2. The capacitor Cs2 holds the signal voltage Vsig written by the sampling performed by the second sampling transistor 28.

The sampling transistor 23 sets a voltage corresponding to the signal voltage Vsig held by the capacitor Cs2 to the capacitor Cs1 (first capacitor). As a result, the voltage corresponding to the signal voltage Vsig is set to the gate electrode of the drive transistor 22 (first transistor). When the sampling transistor 23 is turned on, electric charges in the capacitor Cs2 are transferred to Cs1 and Csub according to a capacity ratio between the capacitors Cs2 and Cs1, and the capacitor Csub (the electric charges are redistributed). For calculation of the amount of electric charges to be transferred, a combined capacity of Cs1 and Csub may be regarded as a capacity value of the first capacitor according to the present embodiment. A series connection of Cs1 and Csub may be regarded as the first capacitor according to the present embodiment.

The signal voltage (voltage held by Cs1) written to the gate electrode of the drive transistor 22 is a voltage corresponding to a value obtained by multiplying a value of the voltage held by the capacitor Cs2 by Cs2/(Cs2+Cs3) where C3 represents the combined capacity of Cs1 and Csub. That is, Vsig=Vsig_1*Cs2/(Cs2+Cs3). Therefore, the signal voltage Vsig_1 to be written to the capacitor Cs2 is a value obtained by multiplying the signal voltage Vsig to be written to the gate electrode (voltage set to the gate electrode according to desired luminance) by (Cs2+Cs3)/Cs2.

The second switching transistor 27 is connected between the signal line 214 and the gate electrode of the drive transistor 22. The second switching transistor 27 is a PMOS transistor, and has a source electrode connected to the signal line 214 and a drain electrode connected to the gate electrode of the drive transistor 22. The second switching transistor 27 samples the signal voltage Vofs supplied from the horizontal drive unit 30 through the signal line 214 to write the signal voltage Vofs to the gate electrode of the drive transistor 22. That is, Vofs is written to Cs1.

Here, the voltage (well potential) of the back gate of the PMOS transistor (S27, 28, 23) having the source electrode or the drain electrode connected to the signal line 214 is set equal in potential to or higher in potential than the black voltage of the video signal supplied from the signal line 214. That is, the well potential is set at VG0 in a case where the black voltage is denoted as VG0, the white voltage is denoted as VG255, and the luminance is represented on a scale of 256. Note that VG0 is the highest, and VG255 is the lowest. The reason will be described later.

Figure 9:
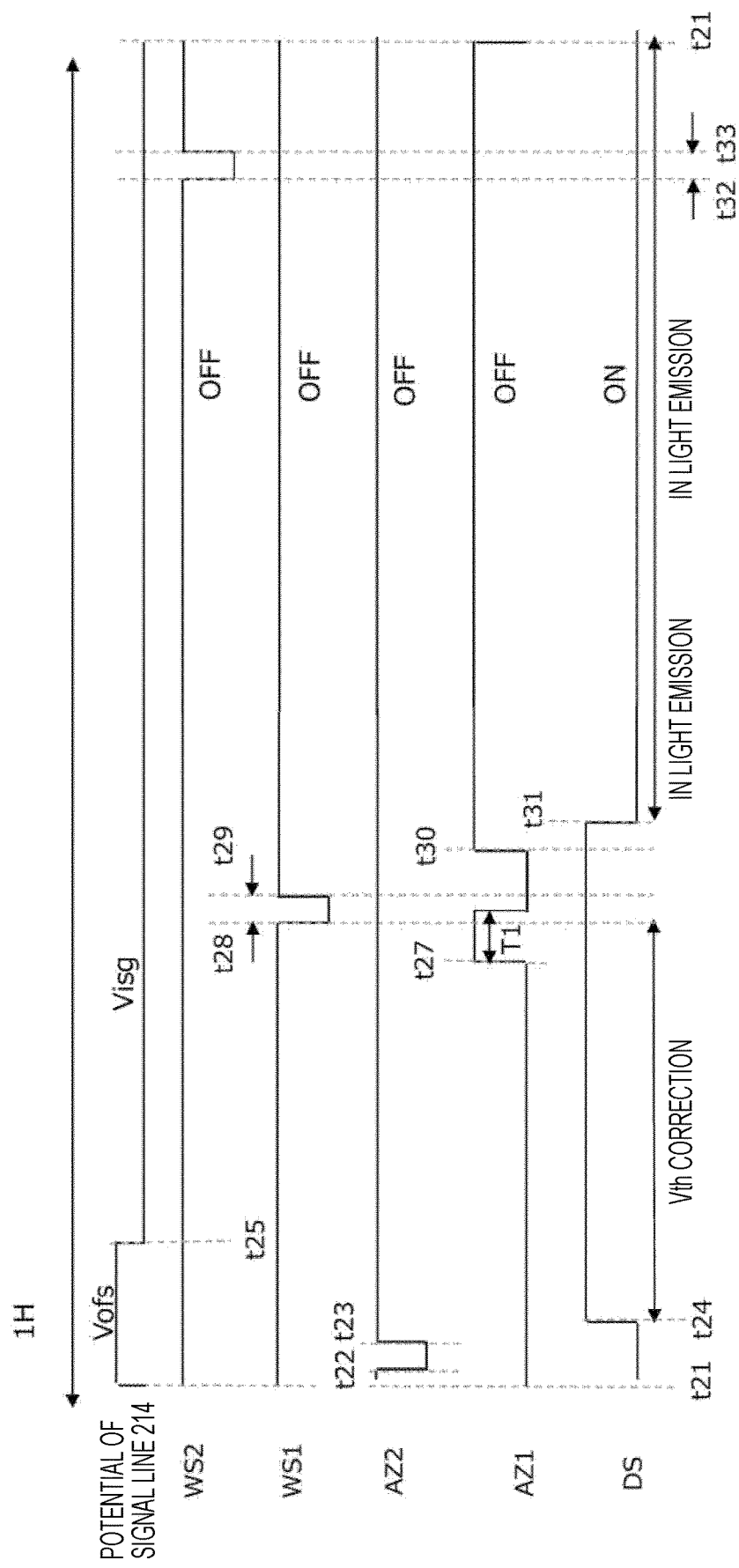
FIG. 9 is a timing waveform diagram of an operation of driving the organic EL display device in FIG. 7.

FIG. 9 is a timing waveform diagram of an operation of driving the organic EL display device 10 in FIG. 7. Changes over time in potentials Vofs/Vsig of the signal line 214, write scanning signals WS2 and WS1, sub-drive signals AZ2 and AZ1, and light emission control signal DS are shown. The video signal of the current frame is written in advance to the capacitor Cs1.

The potential of the signal line 214 is set at Vofs by the horizontal drive unit 30 at time t21 and is held during a period up to time t25. During a period from time t22 to time t23, the second switching transistor 27 is turned on by the sub-drive scanning unit 503 to write the offset voltage Vofs to the capacitor Cs1. The light emission control transistor 24 is turned off by the drive scanning unit 502 at time t24 to correct the threshold of the drive transistor 22 (Vth correction) in a similar manner to the comparative example in FIG. 2.

During period T1 from time t27, the switching transistor 25 is turned off by the sub-drive scanning unit 503, and at time t28 within the off period, the sampling transistor 23 is turned on. As a result, electric charges accumulated in the capacitor Cs2 is distributed (transferred) between the capacitor Cs2, and the capacitors Cs1 and Csub, and a voltage corresponding to the signal voltage held by the capacitor Cs1 is set (held by the capacitor Cs1) to the gate electrode of the drive transistor 22. That is, the gate electrode of the drive transistor 22 has a voltage corresponding to desired display luminance. Note that the sampling transistors 23 in all the pixel rows are simultaneously turned on at time t28.

Thereafter, the sampling transistor 23 is turned off at time t29, and the switching transistor 25 is turned off at time t30. Note that, after the end of period T1, the switching transistor 25 is turned on, and then the switching transistor 25 is kept off up to time t30, so that the electric charges are prevented from flowing out to the organic EL diode, and at the time of electric charge distribution, the distribution is appropriately performed. When the drive scanning unit 502 turns on the light emission control transistor 24 at time t31, the organic EL diode 21 emits light. That is, the transition to the light emission period is made. The light emission control transistors 24 in all the pixels 231 are simultaneously turned on, which brings about the surface batch light emission.

The video signal of the next frame is written during the light emission period. During the light emission period (or during a period from time t29 to time t31), the potential of the signal line 214 is set at the signal voltage Vsig of the video signal for the next frame. In the example in FIG. 9, the signal voltage of the video signal for the next frame is identical in value to the signal voltage of the video signal for the last frame, but need not be identical. The second sampling transistor 28 is turned on at time t32 within the light emission period. As a result, the signal voltage of the video signal for the next frame is written to the capacitor Cs2. At time t33, the second sampling transistor 28 is turned off.

In the drive sequence in FIG. 9, as described above, the switching transistor 25 is turned off during period T1 from time t27 at the time of electric charge distribution of the capacitor Cs2 (the sub-drive signal AZ1 is set at the high voltage). The sampling transistor 23 connects the capacitor Cs2 and the capacitor Cs1 during at least a part of a period during which at least the switching transistor 25 does not short-circuit the connection node between the switching transistor 25 and the organic EL diode 21 to the reference voltage VSS. This allows a reduction in lateral crosstalk and an increase in display contrast. Note that it is also possible to keep the switching transistor 25 on without turning off the switching transistor 25.

Figure 10:
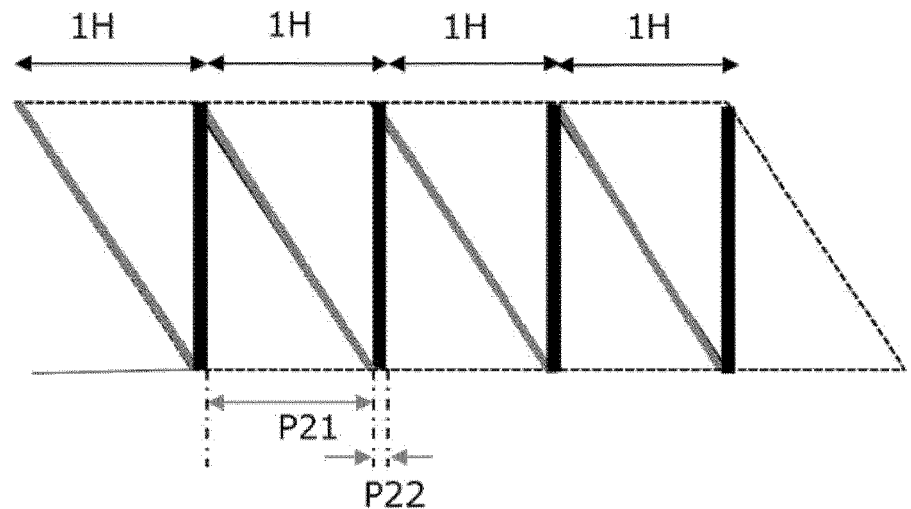
FIG. 10 is a diagram illustrating a relation between a length of a light emission period and a length of a non-light emission period in the drive sequence in FIG. 9.

FIG. 10 is a diagram showing a relation between a length of a light emission period P21 and a length of a non-light emission period P22 within one horizontal period (one frame) in the drive sequence shown in FIG. 9. During the light emission period P21, not only the light emission, but also the write of the signal voltage of the video signal for the next frame to the capacitor Cs2 is performed. During the non-light emission period P22, the threshold correction preparation, the threshold correction, the write of the voltage to the gate electrode of the drive transistor 22 using the capacitor Cs2, and the like are performed. The write of the video signal for the next frame can be performed in the light emission period of the current frame, so that the length of the light emission period can be made sufficiently long. That is, a ratio of the light emission period P21 to one horizontal period can be sufficiently increased. That is, it is possible to perform the surface batch light emission with a high duty cycle. It is therefore possible to solve or improve the problem in the comparative example such as low luminance or the occurrence of flickers.

In the pixel 231 in FIG. 7 or FIG. 8, the well (N-well) potential of the PMOS transistor having the source electrode (or drain electrode) connected to the signal line 214, that is, the voltage of the substrate, is equal to the potential of the black voltage of the video signal. In a case where the black voltage is denoted as VG0, the white voltage is denoted as VG255, and the luminance is represented on a scale of 256, the well potential is VG0. VG0 is the highest, and VG255 is the lowest. The reason will be described below.

As described with reference to FIG. 9, the gate voltage of the drive transistor 22 applied to the capacitor Cs1 corresponds to a value obtained as a result of the capacitance distribution between the capacitor Cs2, and the capacitors Cs1 and Csub. Therefore, when VCCP is applied to the gate in order to output the black luminance, it is necessary to set a voltage higher than VCCP as the black voltage (=VG0) of the video signal VSIG supplied from the video signal line 214. In this state, in a case where the potential of the well (N-well) of the transistor having the source electrode (or the drain electrode) connected to the signal line 214 is VCCP, a current flows from the potential VG0 of the signal line 214 to the N-well at a PN junction, and there is a possibility that appropriate circuit drive is not performed. Therefore, the well potential of the PMOS transistor (the sampling transistor 23, the second sampling transistor 28, the second switching transistor 27) having the source electrode (or the drain electrode) connected to the signal line 214 is equal to the black voltage VG0. The black voltage is an example of the maximum voltage among a plurality of voltages that can be set to the gate electrode to produce a plurality of levels of luminance. The well potential (voltage of the substrate) is set at a value greater than or equal to the VSIG voltage necessary for supplying the maximum voltage to the gate electrode (first terminal or control terminal) of the drive transistor 22. Note that the well potential of the other PMOS transistors (22, 24, 25) may be VG0, but is desirably VCCP with consideration given to the junction breakdown voltage, and is VCCP in the example in FIG. 7 or FIG. 8.

(Modification 1)

Figure 11:
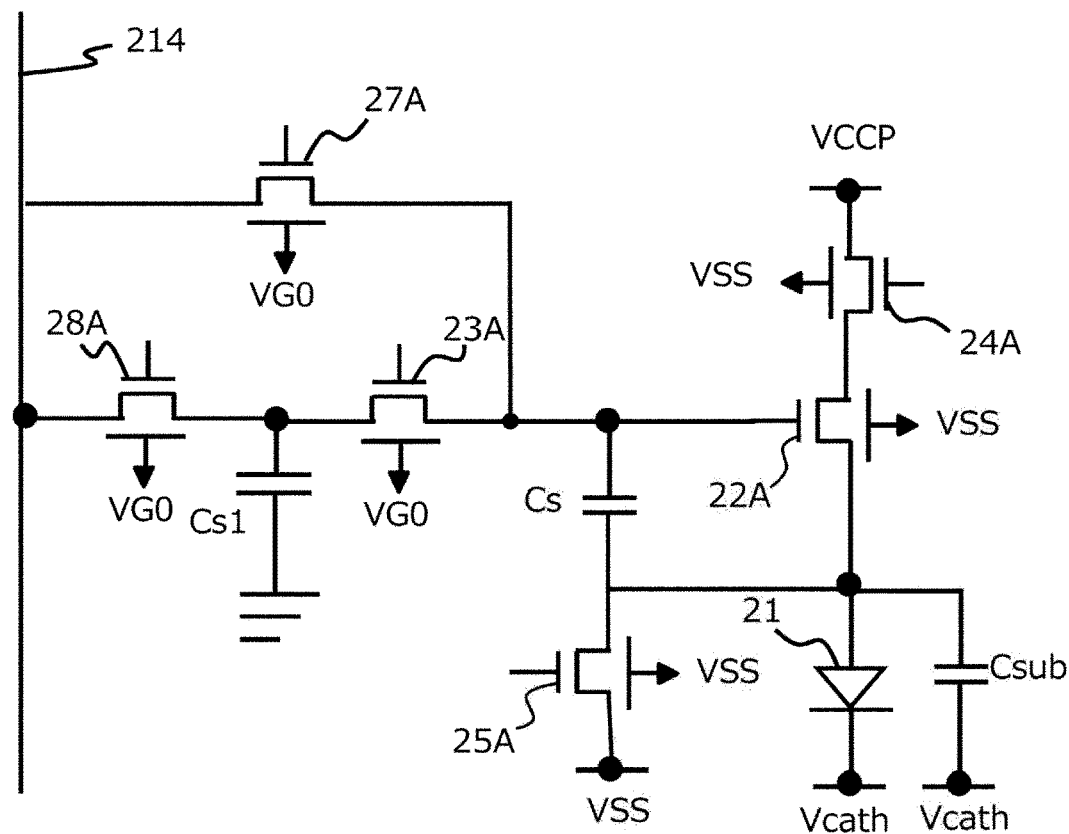
FIG. 11 is a diagram illustrating a modification 1 of the pixel according to the embodiment of the present disclosure.

FIG. 11 illustrates a modification 1 of the pixel (pixel circuit) according to the embodiment of the present disclosure. The pixel in FIG. 11 can be used as each pixel of the pixel array unit 20 in FIG. 7. The pixel in FIG. 11 is different from the configuration in FIG. 7 or 8 in that transistors included in the pixel are N-channel MOS transistors (NMOS transistors). Transistors identical in function to the transistors in FIG. 7 or 8 are each denoted by a reference numeral obtained by appending a symbol "A" to a corresponding reference numeral. The scanning line 211, the drive line 212, the sub-drive line 213, the second scanning line 251, and the second sub-drive line 253 are not illustrated. A well potential (substrate voltage) of transistors 27A, 28A, and 23A is set at VG0 in a similar manner to the above-described embodiment. Furthermore, a well potential of transistors 22A and 25A is set at the reference potential VSS.

(Modification 2)

Figure 12:
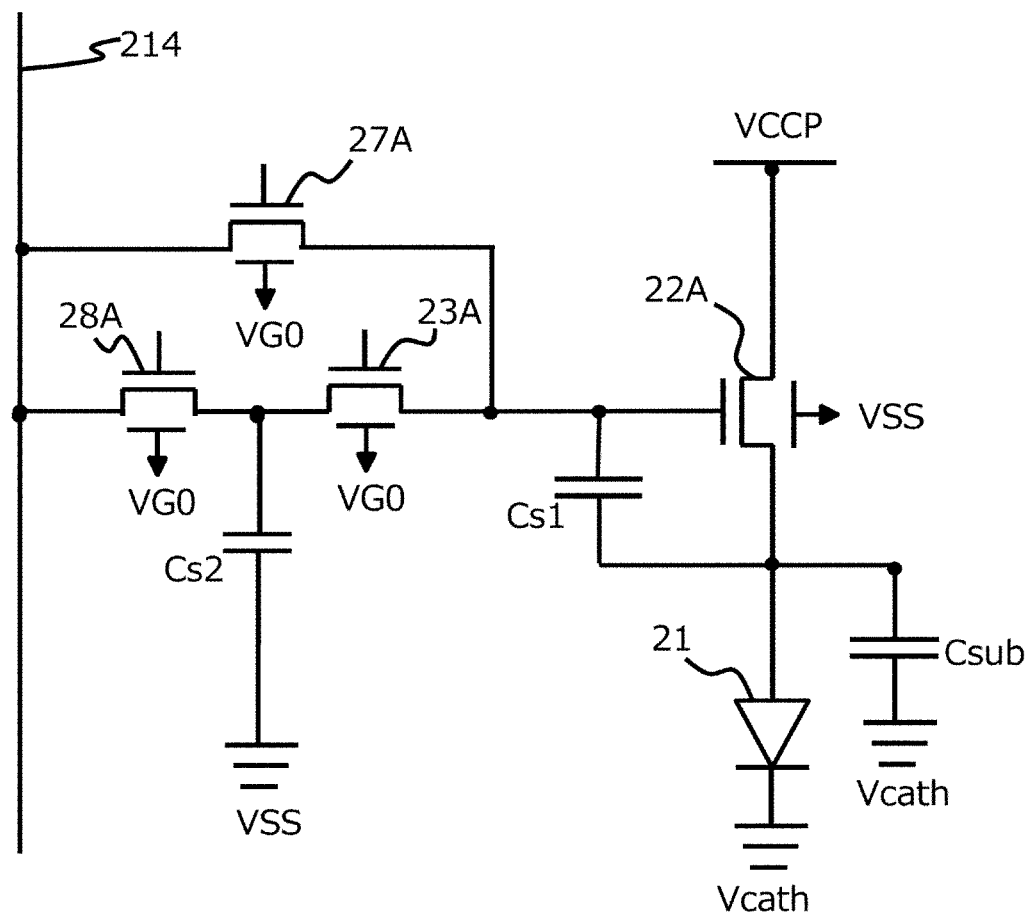
FIG. 12 is a diagram illustrating a modification 2 of the pixel according to the embodiment of the present disclosure.

FIG. 12 illustrates a modification 2 of the pixel (pixel circuit) according to the embodiment of the present disclosure. The pixel in FIG. 11 can be used as each pixel of the pixel array unit 20 in FIG. 7. The pixel in FIG. 12 is different from the configuration of the modification 1 in FIG. 11 in that neither the light emission control transistor 24A nor the switching transistor 25A is provided. During the light emission period of the current frame, the second sampling transistor 28A is turned on to write the video signal of the next frame from the signal line 214 to the capacitor Cs2. When the light emission period of the current frame ends, and the period of the next frame starts, the second switching transistor 27A is turned on to write the reference signal Vofs, so as to perform the threshold correction processing. Thereafter, the sampling transistor 23A is turned on to redistribute the electric charges held in the capacitor Cs2 to the capacitor Cs1 and the capacitor Csub. As a result, a voltage corresponding to the signal voltage held by the capacitor Cs2 is written to the gate electrode (capacitor Cs1) of the drive transistor 22A, thereby causing the organic EL diode 21 to emit light with desired luminance.

Note that the above-described embodiments have been given as examples for embodying the present disclosure, and the present disclosure can be implemented in various other forms. For example, various modifications, substitutions, omissions, or combinations thereof can be made without departing from the gist of the present disclosure. Such modifications, substitutions, omissions, and the like also fall within the scope of the present disclosure and further fall within the scope of the invention recited in the claims and the equivalents thereof.

Furthermore, the effects of the present disclosure described herein are merely examples, and other effects may be provided.

Note that the present disclosure may have the following configurations.

[Clause 1]

A pixel circuit including:
- a first transistor configured to control a current supplied to a light emitting element according to a voltage supplied to a first terminal;
- a first capacitor configured to hold the voltage supplied to the first terminal;
- a second transistor configured to sample a signal voltage of a video signal line;
- a second capacitor configured to hold the signal voltage sampled by the second transistor; and
- a third transistor configured to connect the second capacitor and the first capacitor and set a voltage corresponding to the signal voltage to the first capacitor by transferring electric charges accumulated in the second capacitor to the first capacitor.

[Clause 2]

The pixel circuit according to clause 1, in which the third transistor provides, to the first capacitor, an amount of electric charges corresponding to a ratio between the first capacitor and the second capacitor.

[Clause 3]

The pixel circuit according to clause 1 or 2, in which during a first light emission period of a first frame of a video signal during which the first transistor supplies the current to the light emitting element, the second transistor samples a signal voltage for a second frame from the video signal line, the second capacitor holds the signal voltage for the second frame, and the third transistor connects the second capacitor and the first capacitor during the second frame and sets, to the first capacitor, a voltage corresponding to electric charges accumulated in the second capacitor during the first light emission period.

[Clause 4]

The pixel circuit according to clause 3, further including a fourth transistor configured to connect the video signal line and a control terminal of the first transistor, in which
the fourth transistor receives an offset voltage for correcting a threshold of the first transistor from the video signal line and supplies the offset voltage to the control terminal of the first transistor during the second frame, and
the third transistor connects the second capacitor and the first capacitor after end of correction processing on the threshold.

[Clause 5]

The pixel circuit according to any one of clauses 1 to 4, in which
the second transistor and the third transistor are each formed in a well of a silicon substrate, a voltage corresponding to luminance to be displayed among a plurality of levels of luminance is set to the first terminal, and
a potential of the well is set greater than or equal to a value of the signal voltage necessary for providing, to the first terminal, a maximum voltage that needs to be set to the first terminal among the plurality of levels of luminance.

[Clause 6]

The pixel circuit according to any one of clauses 1 to 5, further including a fifth transistor configured to short-circuit a connection node between the light emitting element and the first transistor to a reference voltage, in which the third transistor connects the second capacitor and the first capacitor during at least a part of a period during which at least the fifth transistor does not short-circuit the connection node to the reference voltage.

[Clause 7]

The pixel circuit according to any one of clauses 1 to 6, in which the first terminal is a control terminal of the first transistor.

[Clause 8]

The pixel circuit according to any one of clauses 1 to 7, in which the first transistor, the second transistor, and the third transistor are P-channel MOS transistors.

[Clause 9]

The pixel circuit according to any one of clauses 1 to 7, in which the first transistor, the second transistor, and the third transistor are N-channel MOS transistors.

[Clause 10]

The pixel circuit according to any one of clauses 1 to 9, further including the light emitting element.

[Clause 11]

A display device including:

a pixel circuit including a light emitting element, a first transistor configured to control a current supplied to the light emitting element according to a voltage supplied to a first terminal, a first capacitor configured to hold the voltage supplied to the first terminal, a second transistor configured to sample a signal voltage of a video signal line, a second capacitor configured to hold the signal voltage sampled by the second transistor, and a third transistor configured to connect the second capacitor and the first capacitor and set a voltage corresponding to the signal voltage to the first capacitor by transferring electric charges accumulated in the second capacitor to the first capacitor; and a drive circuit configured to control an operation of the second transistor and an operation of the third transistor.

[Clause 12]

A driving method including:

supplying a voltage held by a first capacitor to a first terminal of a first transistor, the first transistor being configured to control a current supplied to a light emitting element;

driving the first transistor according to the voltage supplied to the first terminal;

sampling a signal voltage of a video signal line;

holding, by a second capacitor, the signal voltage sampled; and connecting, after the signal voltage is held by the second capacitor, the second capacitor and the first capacitor and setting a voltage corresponding to the signal voltage to the first capacitor by transferring electric charges accumulated in the second capacitor to the first capacitor.

REFERENCE SIGNS LIST

Cs1, Csub Capacitor (first capacitor)
Cs2 Capacitor (second capacitor)
10 Organic EL display device
20 Pixel array unit
21 Organic EL diode (organic EL element)
22 Drive transistor (first transistor)
22A Drive transistor (first transistor)
23 Sampling transistor (third transistor)
23A Sampling transistor (third transistor)
24 Light emission control transistor
24A Light emission control transistor
25 Switching transistor (fifth transistor)
25A Switching transistor (fifth transistor)
27 Second switching transistor (fourth transistor)
27A Second switching transistor (fourth transistor)
28 Second sampling transistor (second transistor)
28A Second sampling transistor (second transistor)
30 Horizontal drive unit
35 Common power supply line
36 Common reference line
40 Vertical drive unit
201 Pixel (pixel circuit)
201B Pixel
201G Pixel
201R Pixel
211 Scanning line
212 Drive line
213 Sub-drive line
214 Signal line
214B Signal line
214G Signal line
214R Signal line
231 Pixel (pixel circuit)
231R Pixel
231B Pixel
231G Pixel
251 Scanning line (second scanning line)
253 Sub-drive line (second sub-drive line)
401 Scanning unit
402 Drive scanning unit
403 Sub-drive scanning unit
501 Scanning unit
502 Drive scanning unit
503 Sub-drive scanning unit

The invention claimed is:

1. A pixel circuit, comprising:

a first transistor configured to supply, in a light emission period of a first frame of a video signal, a current to a light emitting element based on a first voltage at a specific terminal of the first transistor;

a first capacitor configured to hold the first voltage;

a second transistor configured to sample, in the light emission period, a signal voltage of a video signal line, wherein the signal voltage corresponds to a second frame of the video signal;

a second capacitor configured to hold the sampled signal voltage in the light emission period; and a third transistor configured to:
connect the second capacitor to the first capacitor in the second frame and the light emission period; and
set, to the first capacitor, a second voltage corresponding to the signal voltage by transfer of electric charges accumulated in the second capacitor to the first capacitor, wherein the electric charges are accumulated in the second capacitor in the light emission period.

2. The pixel circuit according to claim 1, wherein the third transistor is further configured to transfer, to the first capacitor, an amount of the electric charges corresponding to a ratio between the first capacitor and the second capacitor.

3. The pixel circuit according to claim 1, further comprising a fourth transistor configured to:
connect the video signal line to a control terminal of the first transistor;
receive, from the video signal line, an offset voltage for correction of a threshold of the first transistor; and
supply the offset voltage to the control terminal of the first transistor in the second frame,
wherein the third transistor is further configured to connect the second capacitor to the first capacitor after end of the correction of the threshold.

4. The pixel circuit according to claim 1, wherein
the second transistor and the third transistor are in a well of a silicon substrate, and
the specific terminal has a maximum voltage corresponding to a level of luminance among a plurality of levels of luminance, based on a potential of the well that is greater than or equal to the signal voltage.

5. The pixel circuit according to claim 1, further comprising a fifth transistor configured to short-circuit a connection node to a reference voltage, wherein
the connection node is between the light emitting element and the first transistor, and
the third transistor is further configured to connect the second capacitor to the first capacitor in at least a part of a period in which at least the fifth transistor does not short-circuit the connection node to the reference voltage.

6. The pixel circuit according to claim 1, wherein the specific terminal is a control terminal of the first transistor.

7. The pixel circuit according to claim 4, wherein the first transistor, the second transistor, and the third transistor are P-channel MOS transistors.

8. The pixel circuit according to claim 4, wherein the first transistor, the second transistor, and the third transistor are N-channel MOS transistors.

9. The pixel circuit according to claim 1, further comprising the light emitting element.

10. A display device, comprising:
a pixel circuit including:
a light emitting element;
a first transistor configured to supply, in a light emission period of a first frame of a video signal, a current to the light emitting element based on a first voltage at a specific terminal of the first transistor;
a first capacitor configured to hold the first voltage;
a second transistor configured to sample, in the light emission period, a signal voltage of a video signal line,
wherein the signal voltage corresponds to a second frame of the video signal;
a second capacitor configured to hold the sampled signal voltage in the light emission period; and
a third transistor configured to:
connect the second capacitor to the first capacitor in the second frame and the light emission period; and
set, to the first capacitor, a second voltage corresponding to the signal voltage by transfer of electric charges accumulated in the second capacitor to the first capacitor,
wherein the electric charges are accumulated in the second capacitor in the light emission period; and
a drive circuit configured to control an operation of the second transistor and an operation of the third transistor.

11. A driving method, comprising:
supplying a first voltage held by a first capacitor to a specific first terminal of a first transistor;
supplying, by the first transistor, in a light emission period of a first frame of a video signal, a current a light emitting element based on the first voltage supplied to the specific terminal;
sampling, by a second transistor, a signal voltage of a video signal line in the light emission period,
wherein the signal voltage corresponds to a second frame of the video signal;
holding, by a second capacitor, the sampled signal voltage in the light emission period;
connecting, by a third transistor, after the signal voltage is held by the second capacitor, the second capacitor to the first capacitor in the second frame and the light emission period; and
setting, by the third transistor, a second voltage corresponding to the signal voltage by transferring electric charges accumulated in the second capacitor to the first capacitor,
wherein the electric charges are accumulated in the second capacitor in the light emission period.

12. A pixel circuit, comprising:
a first transistor configured to supply a current to a light emitting element based on a first voltage at a specific terminal of the first transistor;
a first capacitor configured to hold the first voltage;
a second transistor configured to sample a signal voltage of a video signal line;
a second capacitor configured to hold the sampled signal voltage;
a third transistor configured to set, to the first capacitor, a second voltage corresponding to the signal voltage by transfer of electric charges accumulated in the second capacitor to the first capacitor; and
a fourth transistor configured to short-circuit a connection node to a reference voltage, wherein
the connection node is between the light emitting element and the first transistor, and
the third transistor is further configured to connect the second capacitor to the first capacitor in at least a part of a period in which at least the fourth transistor does not short-circuit the connection node to the reference voltage.

* * * * *